United States Patent [19]

Matzen et al.

[11] Patent Number: 5,130,760

[45] Date of Patent: Jul. 14, 1992

[54] BIDIRECTIONAL SURGE SUPPRESSOR ZENER DIODE CIRCUIT WITH GUARD RINGS

[75] Inventors: Walter T. Matzen, Richardson; Ronald B. Foster, Garland, both of Tex.

[73] Assignee: Honeywell Inc., Minneapolis, Minn.

[21] Appl. No.: 714,113

[22] Filed: Jun. 11, 1991

[51] Int. Cl.⁵ .............................................. H01L 29/90
[52] U.S. Cl. .......................................... 357/13; 357/52; 357/23.13; 357/23.8; 357/48; 357/55; 357/41
[58] Field of Search .............. 357/13, 52, 52 D, 23.13, 357/23.8, 40, 41, 55, 52 T, 52 C, 47, 48

[56] References Cited

U.S. PATENT DOCUMENTS

| | | | |
|---|---|---|---|
| 4,876,584 | 10/1989 | Taylor | 357/23.13 |
| 4,922,371 | 5/1990 | Gray et al. | 357/23.13 X |
| 5,027,181 | 6/1991 | Larik et al. | 357/41 |
| 5,032,878 | 7/1991 | Davies et al. | 357/52 X |

FOREIGN PATENT DOCUMENTS

60-257576  12/1985  Japan ................ 357/23.13

*Primary Examiner*—William Mintel
*Attorney, Agent, or Firm*—William D. Lanyi

[57] ABSTRACT

A semiconductor device is provided for use as a bidirectional surge suppressor circuit. It incorporates doped regions of substrate and epitaxial layers which result in a dual Zener diode arrangement having the Zener diodes associated in an opposite polarity arrangement. The semiconductor device comprises a substrate with an epitaxial layer deposited on one of its surfaces. In an upper surface of the epitaxial layer, first and second regions of P type material are diffused with guard rings comprising P+ type material diffused around the first and second regions. The guard rings are heavily doped and extend much deeper than the relatively shallow junctions of P material. A channel stopper of N+ conductivity type material is diffused into the upper surface of the epitaxial layer to provide a channel stopper, or sinker, around both the first and second regions and their associated guard rings and, additionally, between the first and second regions. This structure provides several significant advantages including reduced current leakage reliability, uniform breakdown voltage, crack resistance and a smaller area needed to provide the required thermal capacity.

18 Claims, 7 Drawing Sheets

BIDIRECTIONAL SURGE SUPPRESSOR ZENER DIODE CIRCUIT WITH GUARD RINGS

BACKGROUND OF THE INVENTION

1. Field of the Invention

The present invention is generally related to a surge suppressor circuit and, more particularly, to a semiconductor device which provides a dual Zener diode arrangement constructed in a manner to minimize current leakage, reduce edge cracking, efficiently dissipate heat, provide stable and reliable operation in a hostile environment and maintain a uniform and consistent breakdown voltage. It should be understood that although diodes that ar designed and specified to operate continuously in a voltage breakdown mode are typically referred to as Zener diodes that terminology is not always correct. The mechanisms responsible for electrical breakdown in silicon include both avalanche and Zener types of breakdowns. These breakdowns occur at different value of electric field strength. Zener breakdown usually occur below 5 or 6 volts while avalanche breakdown occurs above 5 or 6 volts. According to this definition, the junction diodes of the present invention would more properly be described as operating under an avalanche mechanism. However, throughout the following description of the present invention, these diodes will be referred to as Zener diodes, following common terminology.

2. Description of the Prior Art

It is well known in the prior art to utilize two Zener diodes in an opposing polarity association for the purpose of providing surge suppression in an integrated circuit. It is also well known to those skilled in the art to provide this type of dual Zener arrangement in a solid state device. However, known constructions of dual Zener packages exhibit disadvantages during operation. These disadvantages will be described in greater detail below in conjunction with FIGS. 4, 5 and 6.

SUMMARY OF THE INVENTION

The present invention provides a semiconductor arrangement in which dual Zener diodes, configured with opposing polarity, are created by the appropriate doping of a semiconductor substrate. In addition, the present invention provides means for reducing reverse current leakage, means for minimizing structural damage due to cracking, means for effectively dissipating heat even though the semiconductor die is extremely small and means for uniformly maintaining consistent breakdown voltage in the Zener diodes to provide a stable and reliable operation in a hostile environment.

Throughout the description of the preferred embodiment of the present invention, the conductivity type of the constitute materials will be described and identified as being P type or N type material. It should be clearly understood that these specific identifications of conductivity type relate to a most preferred embodiment of the present invention and do not limit the invention to only those types of material. Instead, it should be understood that these types of materials can be reversed within the scope of the present invention.

In a preferred embodiment of the present invention, a bidirectional surge suppressor circuit is provided which comprises a semiconductor substrate made of N+conductivity type material with an epitaxial layer of N conductivity type material deposited onto one of its surfaces. In the epitaxial layer, first and second regions of P conductivity type material are provided to function as anode terminals of the two Zener diodes. Each of these two regions is provided with a guard ring of P+conductivity type material. These guard rings are each disposed around their respective associated regions of P type material and each of the guard rings is disposed in overlapping and coincident relation with its associated region. In addition, a channel stopper of N+conductivity type material is disposed around both the first and second regions and their associated guard rings. In addition, the channel stopper of N+conductivity type material is also disposed between the first and second regions of P conductivity type material.

In a most preferred embodiment of the present invention, the two regions of P type material in the epitaxial surface are asymmetric. This asymmetry results from the fact that forward and reverse electrical surge requirements are different in a particular application of the present invention. Therefore, the size differential reduces the overall size of the semiconductor since both P type regions in the epitaxial surface are particularly sized for their specific requirements. In addition, to more effectively dissipate heat, the substrate of the semiconductor device is made much thicker than would normally be required. This thickness provides increased thermal capacity in the device and allows it to withstand power surges of greater energy than would otherwise be possible.

BRIEF DESCRIPTION OF THE DRAWING

The present invention will be more fully understood from a reading of the description of the preferred embodiment in association with the drawing in which.

DESCRIPTION OF THE PREFERRED EMBODIMENT

Throughout the description of the preferred embodiment, like components will be identified by like reference numerals. For the purpose of clarity in illustrating the characteristics of the present invention, accurate proportional relationships of elements have not been maintained in the Figures and, instead, the sizes of certain very small components have been exaggerated. Although the particular dopants used to achieve the conductivity regions of the present invention will not be described particularly throughout the description of the preferred embodiment, it should be understood that boron can be used as a P dopant while phosphorous, arsenic and antimony can be used as N dopants. Similarly, the semiconductor material can be silicon, germanium or any compound semiconductor material such as gallium arsenide. It should be understood that any of these dopants can be used, where appropriate, in a preferred embodiment of the present invention.

Figure 1:
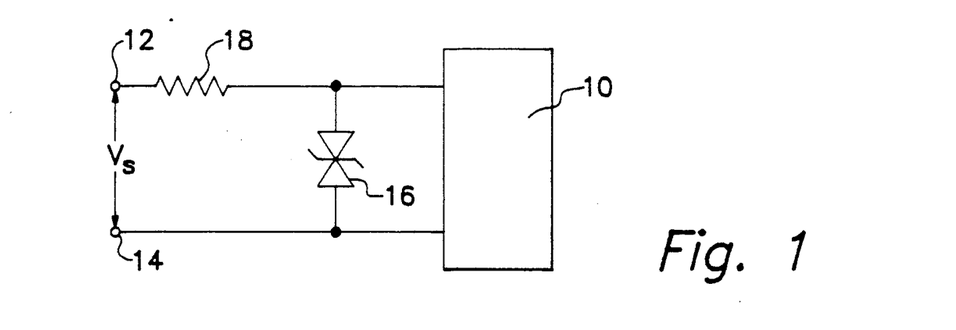
FIG. 1 shows a typical application of a dual Zener diode circuit.

FIG. 1 illustrates a typical application in which a bidirectional surge suppressor circuit can be used. The dual Zener diode arrangement 16 in FIG. 1 is used to protect a device 10, such as an integrated circuit, from transient voltages which could otherwise damage the components of the circuit. In an application where an electronic device is connected to a voltage source, at points 12 and 14, the dual Zener diode arrangement 16 can be connected across the voltage source as shown. The use of a resistor 18 reduces the peak magnitudes of current surges.

Figure 2:
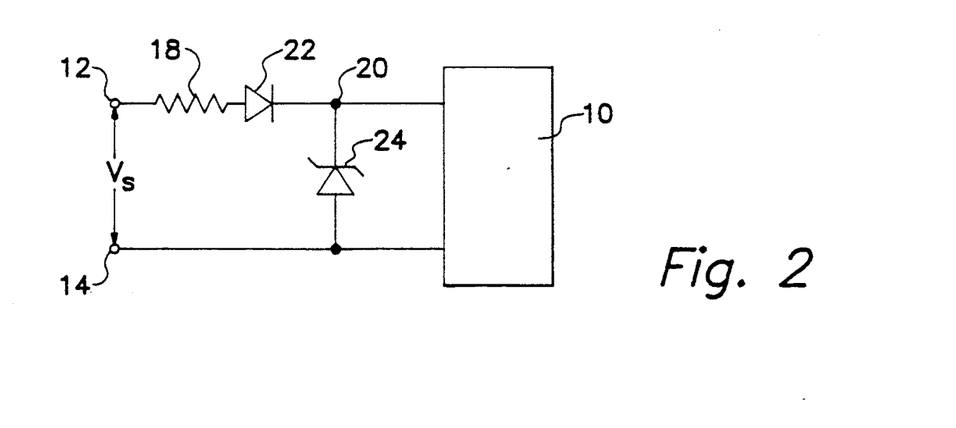
FIG. 2 shows an alternative configuration of a dual Zener diode circuit.

FIG. 2 shows an alternative arrangement in which a bidirectional surge suppressor can be used if a device 10, such as an integrated circuit, is connected to a voltage source by connection points 12 and 14 and, furthermore, if the device 10, such as an integrated circuit, cannot withstand reverse values of voltage. For more significant magnitudes of reverse voltage, the diode 24 is forward biased and shunts the surge voltage. The Zener diodes can be arranged as shown in FIG. 2 with one diode 22 connected in series between a connection point 12 and the device 10 and the other Zener diode 24 being connected across the voltage source as shown. This arrangement provides connection point 20 between the two Zener diodes for permitting the bidirectional surge suppressor to be connected to the device 10 as shown in FIG. 2. The present invention is intended to be a stand alone semiconductor device which is easily connectable in surge suppressing association with another device such as that which is identified by reference numeral 10 in Figures 1 and 2. By merely connecting the present invention across the voltage source and resistor, as shown in FIG. 1, or in association with the leads between the voltage source, resistor and device 10, as illustrated in FIG. 2, the device 10 can be protected from voltage surges that could otherwise destroy or severely degrade the electronic components incorporated in an integrated circuit.

Figure 3:
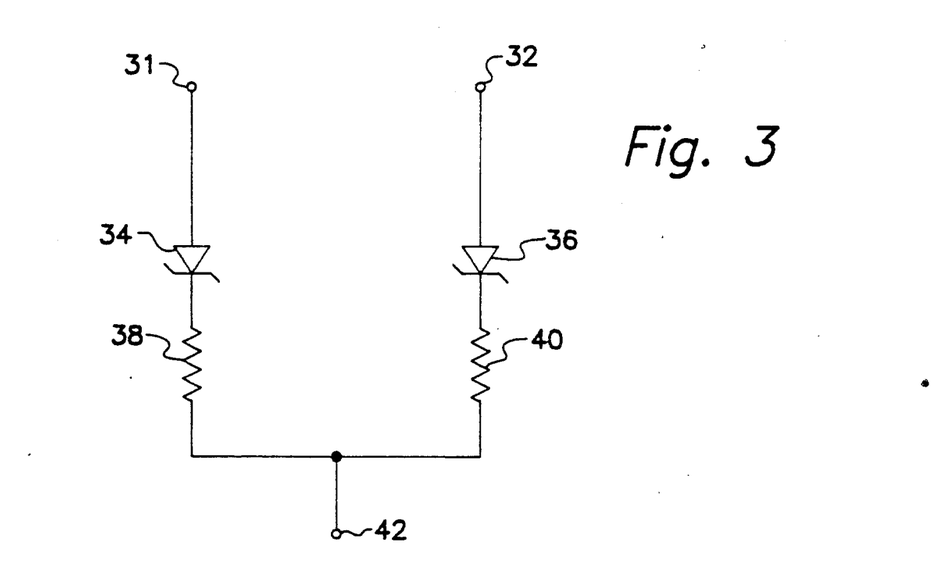
FIG. 3 shows an equivalent circuit to that which is provided by the present invention.

FIG. 3 illustrates a schematic representation of a circuit that is generally equivalent to that provided by the present invention. Two connection points, 31 and 32, are provided to connect two Zener diodes 34 and 36 in opposing polarity association as shown in FIG. 3. Resistances 38 and 40 represent the internal resistance provided by the semiconductor substrate of the present invention as will be described in greater detail below. These resistances also represent the fact that an increase of avalanche voltage occurs due to the rising temperature during a breakdown occurrence. Thermal voltage is also represented as a resistor in equivalent circuit diagrams. These various phenomena are represented by resistors 38 and 40 in FIG. 3. Connection point 42 is available, in a preferred embodiment of the present invention, to permit the type of arrangement shown in FIG. 2. In other words, connection point 42 in FIG. 3 serves to provide the connection point 20 in FIG. 2.

Dual Zener diodes associated to function as a bidirectional surge suppressing circuit are well known to those skilled in the art. Furthermore, it is known that these types of circuits can be economically provided in a semiconductor package. However, known techniques for producing this type of bidirectional surge suppressing circuit limit the effectiveness of the device because of certain disadvantageous attributes that are present in the device when it is manufactured according to those known processes and designs.

Figure 4:
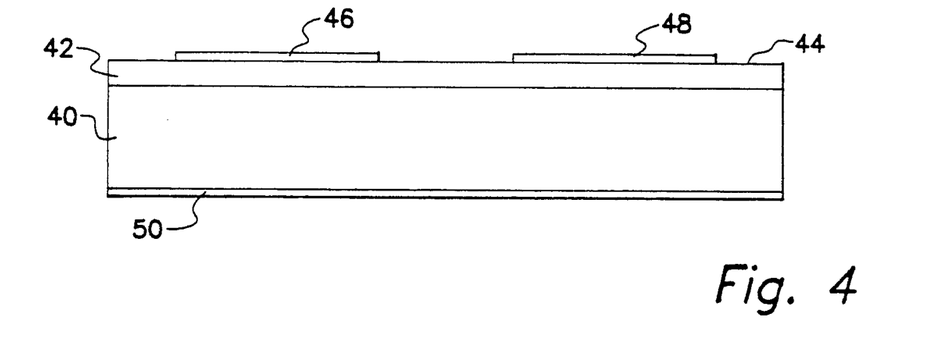
FIGS. 4, 5 and 6 shown successive steps in manufacturing a dual Zener diode semiconductor device made in accordance with techniques known to those skilled in the art.
Figure 5:
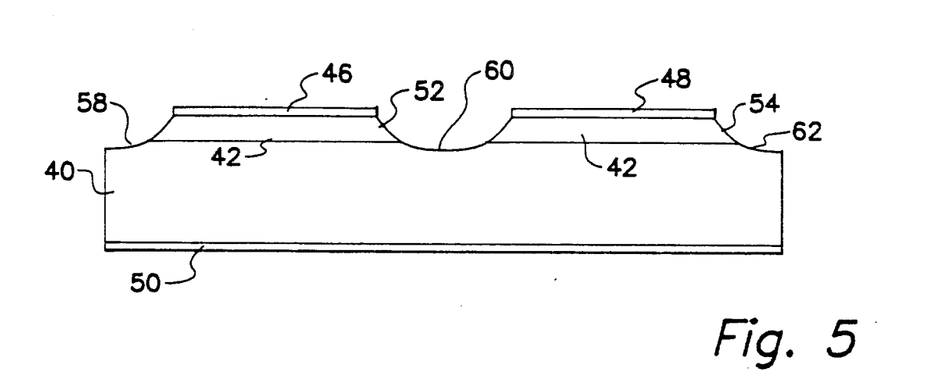
Figure 6:
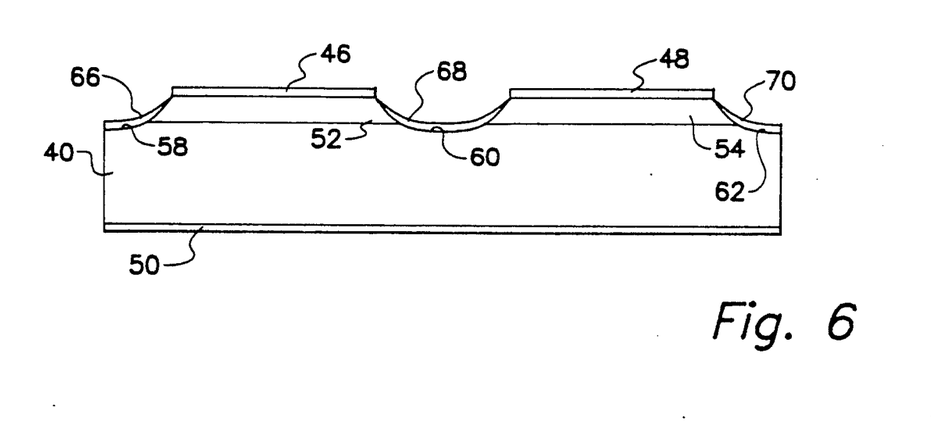

FIGS. 4, 5 and 6 represent sequential manufacturing steps during the production of a solid state bidirectional surge suppressing circuit made according to techniques currently utilized by those skilled in the art. FIG. 4 shows a substrate 40 of an N conductivity type material with a layer 42 that comprises P conductivity type material. On an upper surface 44 of the P type material, two conductive pads, 46 and 48, are disposed. These pads are typically metallic and are attached to the upper surface 44 for the purpose of providing a suitable electrical connection point between the device shown in FIG. 4 and an external circuit. Another conductive pad 50 is applied to the opposite surface of the device as shown in FIG. 4. Regions of the device are selectively removed to produce the configuration shown in FIG. 5. These etched regions are identified by reference numerals 58, 60 and 62 in FIG. 5. As can be seen, two distinct regions, 52 and 54, of P conductivity type material are produced by etching away the other portions of the P type material 42 that had originally been diffused into the upper surface 44 of the substrate 40. These two regions are physically separated from each other and disposed electrically between the conductive pads 46 and 48 and the substrate 40 which comprises N conductivity type homogeneously doped material.

FIG. 6 illustrates the components shown in FIG. 5 after the application of a glass passivation layer to protect the exposed portions of the semiconductor materials from effects that could otherwise be caused by exposure to the ambient atmosphere. The regions of glass passivation are identified in FIG. 6 by reference numerals 66, 68 and 70. The structure shown in FIG. 6 provides a dual Zener diode arrangement that serves as a bidirectional surge suppressor circuit. However, certain problems exist when the techniques described above in conjunction with FIGS. 4, 5 and 6 are used to manufacture this type of device. For example, the junctions are not effectively oxide passivated. In addition, the glass passivation leaves a potentially unstable surface and is susceptible to cracking as a result of the sawcut operations and during subsequent handling.

Figure 7:
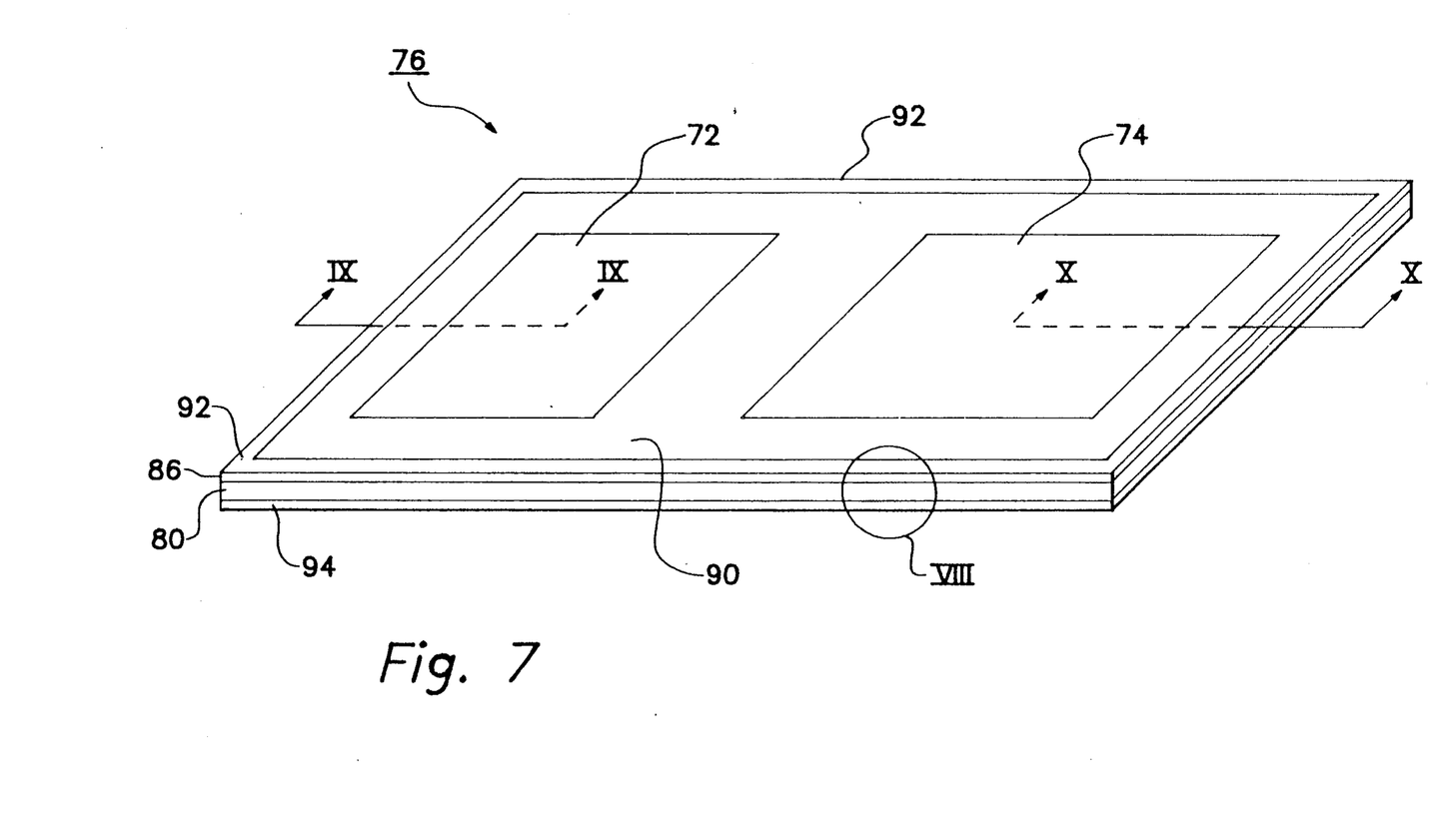
FIG. 7 shows a perspective representation of the present invention.
Figure 8:
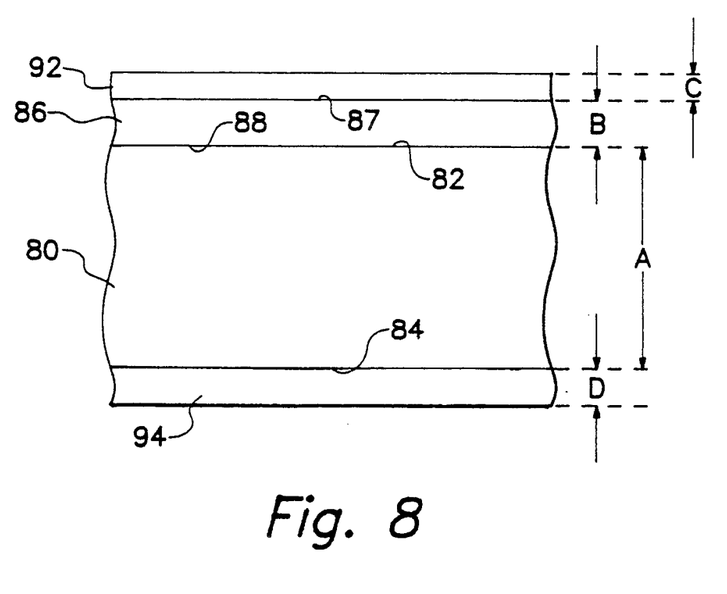
FIG. 8 shows a partial enlarged view of the device shown in FIG. 7.

FIG. 7 is a perspective illustration of a semiconductor device made in accordance with a preferred embodiment of the present invention. The discussion relating to FIG. 7 also refers to components that are shown in the enlarged and sectional views of FIGS. 8, 9, and 10. With particular reference to FIGS. 7 and 8, the present invention comprises two metallic connection pads, 72 and 74, which permit the device 76 to be connected in electrical communication with a device which requires voltage surge suppression protection. A semiconductor substrate 80 of an N+ conductivity type material is provided with an epitaxial layer 86 of N conductivity type material that is deposited onto its upper surface 82. This is typically accomplished by depositing single crystal silicon on the substrate 80. The epitaxial layer 86 has different resistivity (e.g. approximately 0.18 OHM CM) as required for the 28 volt breakdown level in a particularly preferred embodiment of the present invention. The substrate 80 has a lower resistivity to minimize series resistance. The resistivity of the substrate 80 is approximately 0.002 to 0.05 OHM CM. The epitaxial layer 86 has a first surface 87 and a second surface 88. As can be seen in FIGS. 7 and 8, the second surface 88 is disposed in coplaner association with the first surface 82 of the substrate 80. An oxide layer, which is identified by reference numerals 90 and 92, is disposed above the epitaxial layer 86 and in coplaner association with the first surface 87 of the epitaxial layer. The oxide layer is generally formed by passing steam over the surface at a high temperature. As can also be seen, the oxide coatings 90 and 92 cover most of the upper portion of the device with the exception of the two conductive pads, 72 and 74. The conductive pads, in a preferred embodiment of the present invention, are multi layer elements consisting of an adhesion layer, such as chromium, a barrier layer, such as palladium, and gold. Although several different combinations of materials are possible within the scope of the present invention, the metal layer structure is selected for the purpose of improving solderability. For the very shallow diffusions, special metalization processes are required to provide low contact resistance while also preventing alloying of contact metal through the diffused regions. For example, a process can be used which consists of a layer used to provide ohmic contact (e.g. platinum silicide) followed by a metal adhesion layer, a metal barrier layer and a conductive layer which may be solderable.

Disposed in association with the second surface 84 of the substrate 80 is a third conductive pad 94. It should be understood that conductive pads 72, 74 and 94 are usually metallic and, in a preferred embodiment of the present invention, they comprise gold. The conductive pads permit the device 76 to be connected in electrical communication with other circuits which require surge suppressing characteristics. By comparing FIGS. 3 and 7, it should be understood that pad 72 can serve as connection point 31, pad 74 can serve as connection point 32 and pad 94 can serve as connection point 42. The provision of Zener diodes 34 and 36 and the resistive elements 38 and 40 will be described below.

Figure 9:
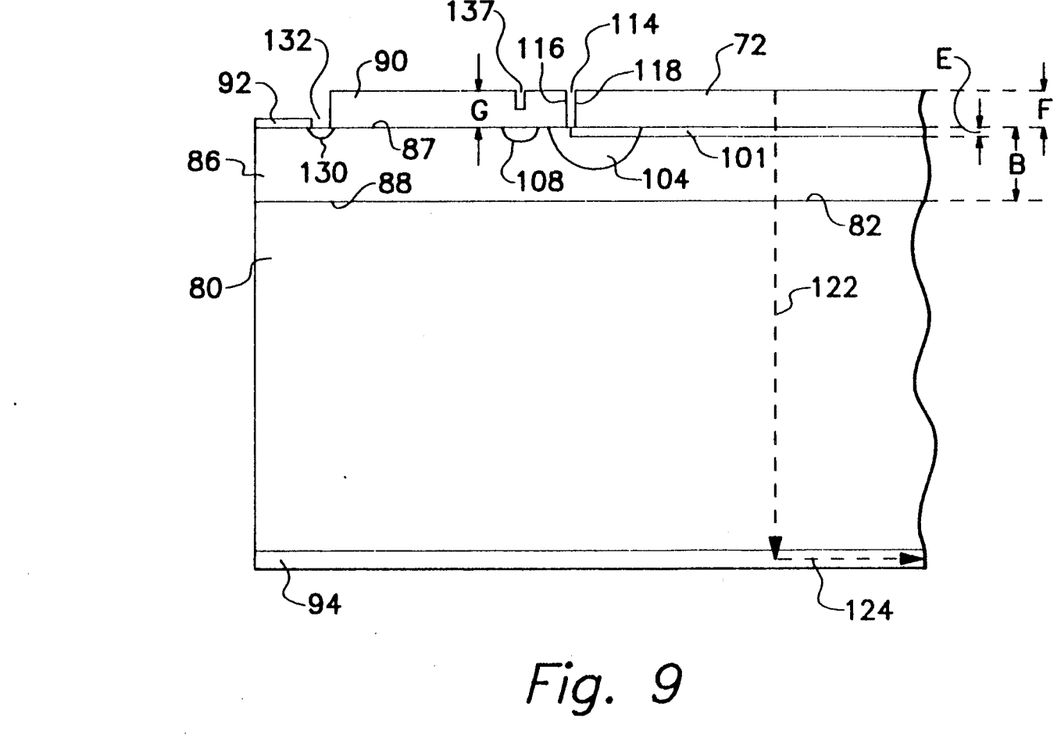
FIG. 9 is a partial sectional view of the device shown in FIG. 7.
Figure 10:
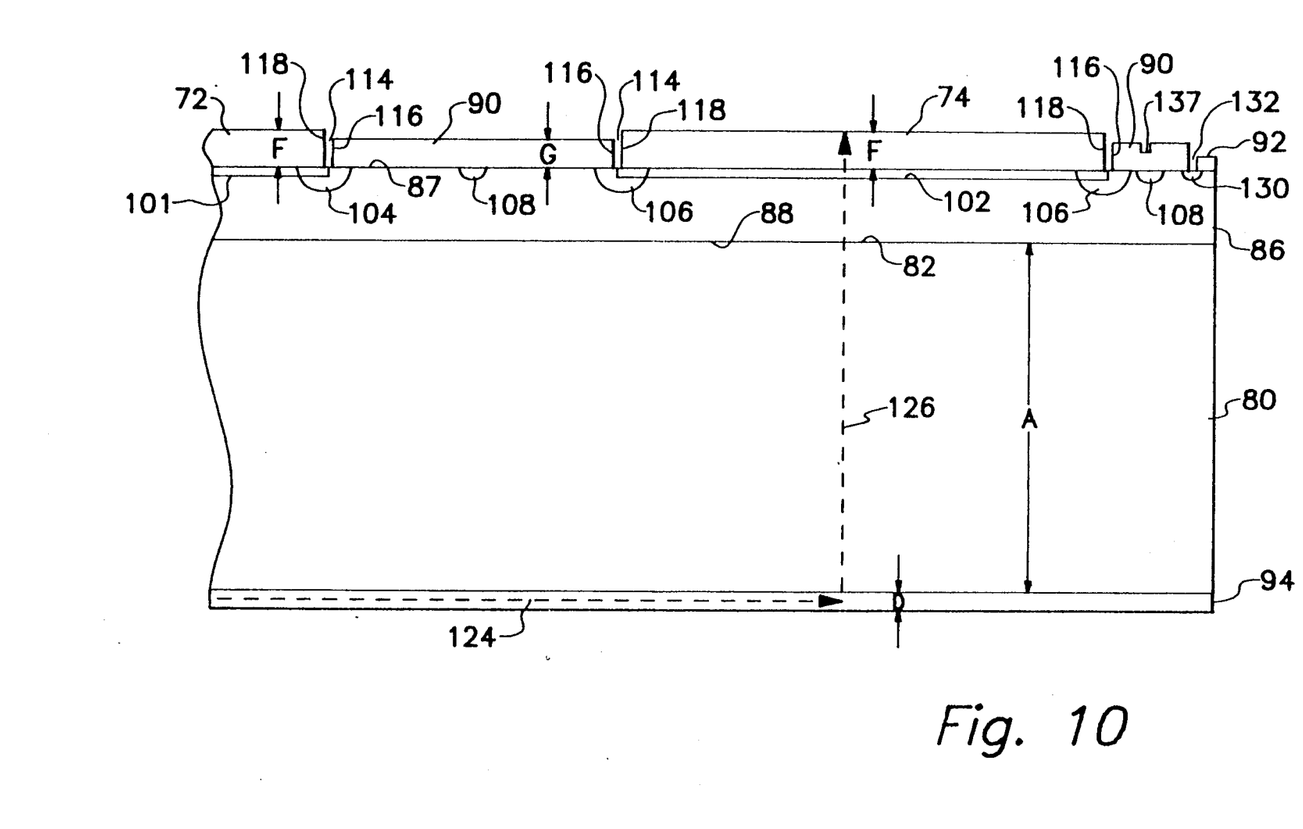
FIG. 10 is a partial sectional view of the device shown in FIG. 7.

FIG. 9 is a sectional view of FIG. 7 taken at a plane which generally bisects the conductive pad 72. The epitaxial layer 86 comprises a first surface 87 and a second surface 88. The second surface 88 is disposed in coplaner association with the first surface 82 of the substrate 80. As also described above, oxide coatings 90 and 92 are disposed above the first surface 87 of the epitaxial layer 86. In the sectional view of FIG. 9, a first region 101 of P conductivity type material is shown disposed in the first surface 87 of the epitaxial layer 86. This first region 101 is formed by gaseous deposition or ion implantation of a P type dopant, such as boron. After the deposition, the dopant is diffused into the epitaxial layer 86 at high temperature. A second region 102 of P conductivity type material is also diffused into the epitaxial layer 86, as illustrated in the section view of FIG. 10. The first and second regions, 101 and 102, are separated from each other, both electrically and physically. Also shown in FIG. 9, a guard ring 104 of P+ conductivity type material is diffused into the epitaxial layer 86 around the first region 101. In a preferred embodiment of the present invention, the guard rings ar formed prior to the formation of the first and second regions. The guard ring 104 is disposed in overlapping and coincident relation with the first region 101 as shown. Similarly, guard ring 106 of P+conductivity type material is provided around the second region 102 in both overlapping and coincident association with the second region as shown in FIG. 10. After the oxide coatings are formed, the guard rings are formed and, during diffusion, the dopant of the guard rings diffuses transversely under the oxide. The guard rings, 104 and 106, perform an important function to improve the operation of a surge suppressor made in accordance with a preferred embodiment of the present invention. If the guard rings were not provided, the corners of the first and second regions would typically break down at a lower voltage than the central portions of those regions. This is primarily due to the junction curvature corners that are present in shallow diffusions such as those that provide the first 101 and second 102 regions in FIG. 10. Junction curvature increases the field strength at the corners and therefore increases the likelihood that breakdown will occur at the corners prior to occurring at the planar surfaces of the shallow diffusions. By providing the much deeper guard rings, 104 and 106, these edges of the first and second diffusion regions are enclosed within the diffusion areas of the guard rings as shown in FIGS. 9 and 10 and the natural tendency to break down at lower voltages, because of the curvature of the edges, is alleviated. The guard rings are graded, with heavier doping occurring towards the surface and the oxide edge. The deepest regions of the guard rings, where the junction is, are more lightly doped. These more lightly doped deeper regions of the guard rings have a much higher breakdown voltage than the more heavily doped portions of the guard rings and the diffused first and second regions. Therefore, the breakdown voltage of the first and second regions can be more accurately and consistently maintained without the deleterious effects that would otherwise occur due to the effect of these sharp corners in shallow diffusions if the guard rings are not provided. Additionally, the corners of the guard ring diffusion and the base diffusion are provided with radii in the plane of the surface to eliminate sharp corners at the edges which would otherwise increase the effect o fringing fields.

Also shown in FIGS. 9 and 10 is a channel stopper 108 which comprises N+ conductivity type material that is diffused into the epitaxial layer 86. The channel stopper 108 is generally formed by deposition of a dopant at a high temperature, or possibly by ion implantation, followed by a high temperature drive-in period in a furnace to diffuse the dopant into the substrate. The geometric relationship between the channel stopper 108 and the first and second regions, 101, and 102, can be seen more clearly in the plane view of FIG. 11 which will be described in greater detail below. The channel stopper 108 extends completely around both the first and second regions, 101 and 102, and also between the first and second regions as shown. The channel stopper 108 prevents inversion of the N type silicon at its surface which might otherwise be caused by negative ions accumulating on the top surface of the oxide coating or within the oxide coating. This process could deleteriously change the N type silicon to a P type material. This P inversion layer would become an extension of the first 101 and/or second 102 regions and allow current conduction to the edge of the chip or between regions 101 and 102. The channel stopper 108 will not invert because of its heavy doping. The channel stopper therefore interrupts the conduction path which might otherwise form on the surface. Channel stoppers 108 could alternatively extend from the position shown in the figures to the edge of the chip rather than be configured as a relatively narrow strip as illustrated in the figure. The distance from the inner edge of the channel stopper 108 to the outer edge of region 104 should be kept to a minimum distance which is sufficient to maintain the required breakdown voltage.

Above the upper surfaces of the first and second regions, 101 and 102, the metallic pads 72 and 74 are provided to facilitate the connection between the present invention and electric circuit such as device 10 in FIGS. 1 and 2. In a preferred embodiment of the present invention, the upper surface of pads 72 and 74 are generally aligned with the upper surface of the oxide coating 90 and, in one particular embodiment of the present invention, extends a very slight amount above the oxide surface 90. With continued reference to FIGS. 9 and 10, it should also be understood that a slight gap 114 may exist between surfaces 116 of the oxide coating 90 and surfaces 118 of the conductive pads. This very slight gap is extremely small and does not directly relate to the functioning of the present invention. A crack stopper 132 is provided to prevent cracks from propagating from the saw cut edge through the oxide. Region 130 facilitates the formation of the crack stopper 132 during manufacture of the related to the present invention.

Comparing FIG. 3 to FIGS. 7, 9 and 10, it should be understood that conductive pads 72 and 74 operate to provide the connection point 31 and 32. In addition, the first regions, 101 and 102, of P type material operate in association with the N type material of the epitaxial layer 86 to provide the diodes, 34 and 36, in FIG. 3. In addition, the epitaxial layer 86 and, to a lesser extent the relatively thick substrate 80 provide the resistance that is represented by resistors 38 and 40 in FIG. 3 which also relate to the avalanche temperature coefficient as described above. It should be clearly understood that the illustrations in FIGS. 7, 8, 9, and 10 do not accurately represent the relative proportional sizes of the elements in a preferred embodiment of the present invention. In general, the vertical dimensions in these figures have been exaggerated to permit very small dimensions to be illustrated more clearly. A more detailed description of the actual dimensions in a preferred embodiment of the present invention will be described below.

When conducting current from conductive pads 72 to conductive pad 74, the conventional current flow through the device shown in FIGS. 9 and 10 is represented by arrows 122, 124 and 126. Assuming that conductive pad 72 is at a sufficient positive voltage potential above that of conductive pad 74 to result in a voltage breakdown of the dual Zener diode arrangement, current will flow from conductive pad 72, through the forward biased junction formed by the first region 101 and the epitaxial layer 86 to the substrate 80. The path of least resistance will direct the current toward conductive pad 94 as indicated by arrow 122. The current will continue to flow through conductive pad 94, as indicated by arrow 124, because of the high conductivity of pad 94 which is usually metallic and, in a preferred embodiment of the present invention, comprises gold or an alloy of gold and silicon. The current will then travel upward through the substrate 80 and the epitaxial layer 86 as indicated by arrow 126 in FIG. 10. After passing through the epitaxial layer, the current continues through the reverse biased junction at the second region 102. The current continues to flow to conductive pad 74. It should be understood from the discussion above that conductive pads 72 and 74 are constructed to be connected in electrical communication with connection points of a circuit which requires surge suppression. It should also be understood that conductive pad 94 can serve the function indicated by reference numeral 42 in FIG. 3. An additional benefit of the low resistivity substrate is that it can provide transverse conduction if poor ohmic contact existed from substrate 80 to oxide coating 90.

In FIGS. 8, 9, 10, and 11, various dimensions are identified by reference letters A-H. Actual dimensions will be identified below for a particular preferred embodiment of the present invention. However, it should be clearly understood that these dimensions do not limit the scope of the present invention and, furthermore, that alternative applications would necessitate the use of different dimensions. Dimension A represents the thickness of substrate 80 which is approximately 0.025 inches. Dimension B represents the thickness of the epitaxial layer 86 which is approximately 0.0015 inches. The thickness of oxide coating 92 is identified by Dimension C which is usually less than dimension G. Although the oxide coatings have been described in terms of particular reference letters identifying their thicknesses, it should be clearly understood that the thickness of the various oxide coatings can vary at different sections of the device. It should also be understood that particular dimensions at particular locations of the prevention are not critical to its operation. The third conductive pad 94 is approximately 1.20 micrometers thick, which is identified as Dimension D. The depth of diffusion for the first and second regions, 101 and 102, is identified by reference letter E which is approximately 1.0 micrometer. The first and second conductive pads, 72 and 74, are approximately 1.20 micrometers thick, as identified by reference letter F. Reference letter G refers to the thickness of the oxide coating 90 which, in a preferred embodiment of the present invention, is 1.0 micrometers thick.

Figure 11:
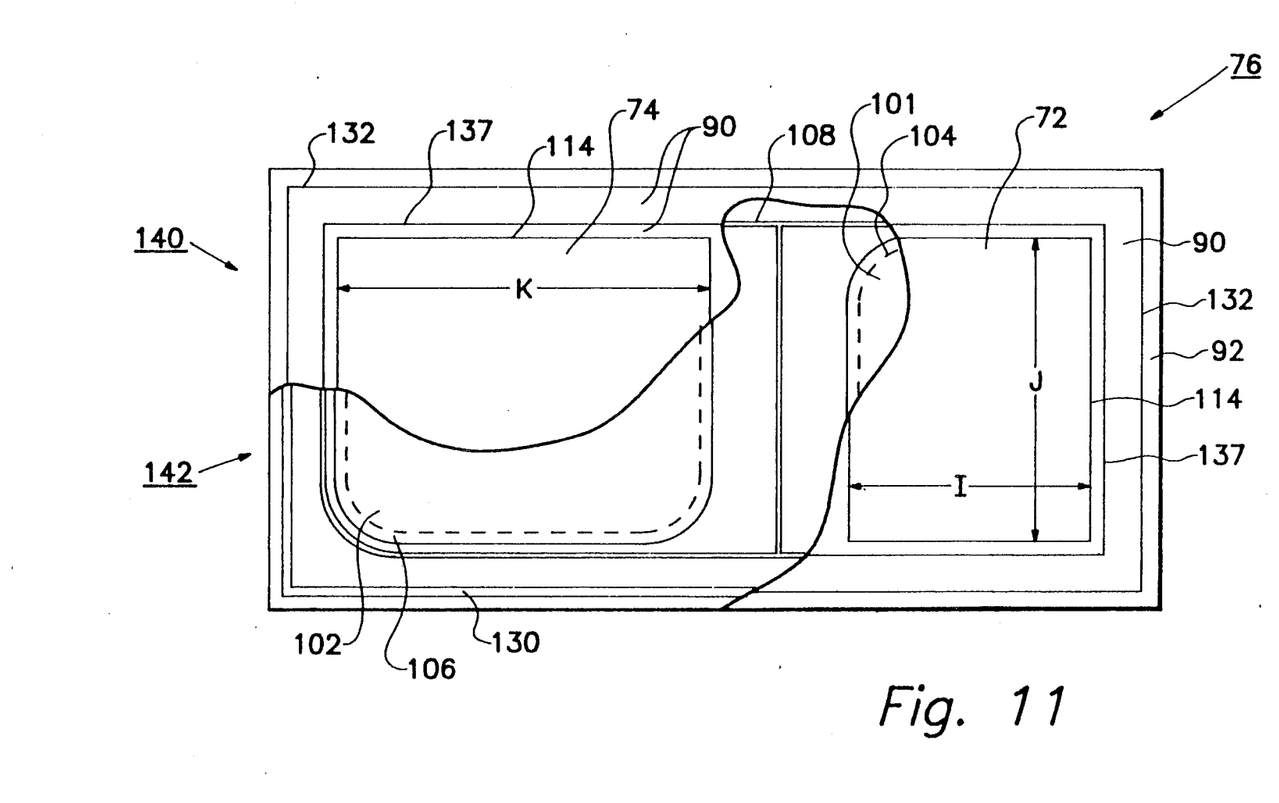
FIG. 11 is a plane view of the present invention with portions of the upper components removed for purposes of illustration.

In FIG. 11, three additional dimensions, I, J and K, are shown. In a preferred embodiment of the present invention, dimension I is approximately 0.033 inches while dimension K is approximately 0.050 inches. This illustrates the asymmetry of the device. Dimension J, which is common to both of the conductive pads, is approximately 0.042 inches in a preferred embodiment of the present invention.

FIG. 11 illustrates a plane view of the device of FIG. 7, but with a portion of the oxide coatings 90 and 92 removed to expose the doped regions of the present invention that comprise the first and second regions, 101 and 102, the first and second guard rings, 104 and 106, and the channel stopper 108. To further illustrate the device, portions of the first and second conductive pads, 72 and 74, have also been removed. As can be seen in the portion 142 of FIG. 11, where the upper elements of the device have been removed, the first and second guard rings, 104 and 106, are disposed around their respective regions in both overlapping and coincident association with their associated region. As also described above, these guard rings comprise P+conductivity type material that is heavily doped and extend deeper into the epitaxial layer 86 than the relatively shallow diffusion of the first and second regions. These guard rings serve the important purpose of providing a graded junction around the relatively shallow diffusion regions. These graded junction have a much higher breakdown voltage than the other shallower portions of the first and second regions because of their greater depth. Because the guard rings, 104 and 106, join with the edges of the first and second regions and the corners are rounded, they eliminate the breakdown problems that would typically occur due to the junction curvature at the edges of the first and second regions of P diffusion material. Therefore, a relatively uniform breakdown voltage exists across the entire bottom portion of the P type material of the first and second regions.

With continued reference to FIG. 11, the channel stopper 108 of N+ conductivity type material extends completely around both the first and second regions and their associated guard rings. It should be understood that channel stopper 108 extends directly beneath grove 137. In addition, part of the channel stopper 108 extends between the two regions and their guard rings. This can be seen by comparing the portion 140, that shows the upper elements of the chip, with portion 142 which illustrates the elements below those upper elements. Therefore, the guard rings provide complete rings around their respective regions and, in addition, the channel stopper 108 completely encloses the two regions within its boundaries. The channel stopper 108 is formed to define two complete rings or enclosures in which the first 101 and second 102 regions are disposed. The channel stopper 108 provides the important function of preventing leakage current from passing across the upper surface 87 of the epitaxial layer 86. Because of the existence of static charges on the oxide coating 90, leakage currents could be induced to flow in the coplaner region at the surface of the epitaxial layer. However, with the channel stopper 108 of N+ conductivity material disposed around the entire assembly of first and second regions and first and second guard rings, the static charges could not achieve a sufficient magnitude to cause a leakage current to pass by the channel stopper 108.

Dimension A, which represents the thickness of the substrate 80 in FIGS. 8, 9, and 10, is significantly thicker than would otherwise be required in bidirectional surge suppression circuits known to those skilled in the art. Typically, the first and second regions and their corresponding conductive pads are made symmetrical to each other in size and shape in devices known to those skilled in the art. However, requirements are not always identical for surge suppression capability in both directions. For example, a particular application of the present invention requires that the device be able to suppress an exponentially decaying surge in the forward direction of 80 volts peak with a 50 millisecond time constant. During this type of surge, the peak current flowing through the device can exceed one ampere.

An associated requirement for the present invention is that it be able to suppress an exponentially decaying surge of 300 volts peak and with a 15 microsecond time constant in both the forward and reverse direction. During this type of surge, peak current through the device can exceed five amperes. However, because of the significant differences in the duration of these two requirements, it can be seen that the forward voltage surge of 80 volts peak with a 50 millisecond time constant imposes a much stricter requirement because of the significant amount of energy flowing into the device. With the much thicker substrate 80, the thermal capacity of the device required to absorb the energy, resulting from the high energy and long time constant surges, can be achieved with a smaller area and a less expensive chip. Surge capability for the high energy pulses depends upon the contact area as well as the total chip volume. Because of the unequal requirements for forward and reverse surge suppression capability, the first region 101 and the second region 102 are unequal in area to minimize overall size of the device. This asymmetry maximizes the efficiency of the present invention by minimizing the area of the contact which is not required to withstand the high energy surge described above. Therefore, the total area can be decreased without reducing surge capability.

In summary, the combination of structures included in the present invention provides many advantages over other bidirectional surge suppressor circuits known to skilled artisans. For example, the guard ring of the present invention provides a passivated junction without decreasing the BVR, or breakdown voltage reverse, at the edges of the diffusions. It also lowers the leakage and increases the reliability of the device. In addition, the present invention provides a channel stopper that virtually eliminates surface currents. In addition, a wide space is provided between the edge of the device and the inner edge of the channel stopper to avoid interruption by saw cracks and a break is provided in the oxide coating to prevent cracks from propagating across the barrier. It should be understood that the groove identified by reference numeral 137 is a step in the oxide coating that is due to the difference in growth conditions between oxide grown on the P type guard rings, the P diffusion regions and the N diffusion regions. In other words, a gap between oxide coatings is used during the diffusion of the channel stopper 108 and then later closed by a subsequent oxidation process. This results in uneven top surfaces of the oxide coatings.

The epitaxial active region of the present invention provides a uniform and reproducible BVR with very low ohmic resistance. In addition, the shallow junction of the present invention allows a low BVR to be provided with achievable epitaxial resistivity. Furthermore, the relatively thick substrate used by the present invention results in a much greater volume which, in turn, provides a greater thermal capacity and lower temperature rise for a given surface area when current flows through the device during voltage surge. In other words, the reduction in the size of the surface area of the present invention reduces the thermal capacity of the device. By increasing the thickness of the substrate, the present invention compensates for this reduced thermal capacity while still permitting the advantages of size reduction in the surface area. The asymmetry of the first and second regions of the present invention allows a smaller area for one of the junctions when forward and reverse surge requirements differ. By combining the significant advantages of these several design features, the present invention provides a bidirectional voltage surge suppressor circuit that minimizes leakage currents, results in predictable and uniform breakdown voltages by avoiding the problems that are normally incumbent with shallow diffusions, minimizes problems related to cracking and provides increased thermal capacity while minimizing the surface area of the device.

Although the present invention has been described inconsiderable detail with significant specificity and has been illustrated to show the particular features of a preferred embodiment, it should be understood that alternative embodiments should be considered within the scope of the present invention.

The embodiments of the invention in which exclusive property or right is claimed are defined as follows:

1. A bidirectional surge suppressor device, comprising:
   a semiconductor substrate of N+ conductivity type material;
   an epitaxial layer of N conductivity type material, said epitaxial layer having first and second surfaces, said second surface being disposed in coplanar association with a first surface of said semiconductor substrate;
   a first region of said first epitaxial surface comprising P conductivity type material;
   a second region of said first epitaxial surface comprising P conductivity type material, said first and second regions being separated from each other;
   a first guard ring of P+ conductivity type material in said first epitaxial surface, said first guard ring being disposed around said first region, said first region being disposed in overlapping and coincident association with said first guard ring;
   a second guard ring of P+ conductivity type material on said first epitaxial surface, said second guard ring being disposed around said second region, said second region being disposed in overlapping and coincident association with said second guard ring; and
   a channel stopper of N+ conductivity type material in said first epitaxial surface, said channel stopper being disposed around said first region and around said second region, said channel stopper being disposed between said first and second regions.

2. The device of claim 1, further comprising:
   first metallic pad disposed on said first epitaxial surface in electrical communication with said first region; and
   a second metallic pad disposed on said first epitaxial surface in electrical communication with said second region.

3. The device of claim 2, further comprising;
   a third metallic pad disposed in electrical communication with a second planar surface of said semiconductor substrate.

4. The device of claim 1, wherein:
   the thickness of said semiconductor substrate is at least fifteen times the thickness of said epitaxial layer.

5. The device of claim 1, wherein:
   said first region comprises an area of said first epitaxial surface that is 40% greater than the area of said second region.

6. The device of claim 2 further composing:
   a coating disposed on said epitaxial layer, said coating having a gap disposed between first and second portions of said coating, said gap being located between said channel stopper and an edge of said epitaxial layer.

7. The device of claim 6, wherein:
   said coating comprises an oxide material.

8. A surge suppressor device, comprising:
   a semiconductor substrate of a predetermined conductivity type;
   an epitaxial layer on a first surface of said semiconductor substrate, said epitaxial layer being of a predetermined conductivity type;
   a first region in said epitaxial layer, said first region being of a predetermined conductivity type;
   a second region in said epitaxial layer, said second region being of a predetermined conductivity type;
   a first guard ring in said epitaxial layer, said first guard ring being of a predetermined conductivity type, said first region being disposed in overlapping association with said first guard ring;
   a second guard ring in said epitaxial layer, said second guard ring being of a predetermined conductivity type, said second region being disposed in overlapping association with said second guard ring;
   a channel stopper of a predetermined conductivity type, said channel stopper being disposed in said epitaxial surface, said channel stopper being disposed around said first guard ring and around said second guard ring, said channel stopper being disposed between said first and second guard rings;
   a first electrically conductive pad on said first epitaxial surface connected in electrical communication with said first region;
   a second electrically conductive pad on said first epitaxial surface connected in electrical communication with said second region;
   a third electrically conductive pad connected in electrical communication with a second surface of said semiconductor substrate; and
   an insulative coating on said epitaxial layer, said insulative coating being disposed over said channel stopper and around said first and second regions.

9. The device of claim 8, wherein:
said semiconductor substrate comprises N+ conductivity type material.

10. The device of claim 8, wherein:
said first and second regions comprise P conductivity type material.

11. The device of claim 8, wherein:
said first and second guard rings comprise P+ conductivity type material.

12. The device of claim 8, wherein:
said channel stopper comprises N+ conductivity type material.

13. The device of claim 8, wherein:
said insulative coating comprises an oxide material.

14. The device of claim 8, wherein:
said epitaxial layer comprises N conductivity type material.

15. The device of claim 8, wherein:
said first, second and third electrically conductive pads comprise gold.

16. The device of claim 8, wherein:
the area of said first region is at least 40% larger than the area of said second region.

17. The device of claim 8, wherein:
said insulation material comprises two oxide portions having a gap between them, said gap being disposed between said channel stopper and an edge of said epitaxial layer.

18. A bidirectional surge suppressor device, comprising:
   a semiconductor substrate of P+ conductivity type material;
   a epitaxial layer of P conductivity type material, said epitaxial layer having first and second surfaces, said second surface being disposed in coplanar association with a first surface of said semiconductor substrate;
   a first region of said first epitaxial surface comprising N conductivity type material;
   a second region of said first epitaxial surface comprising N conductivity type material, said first and second regions being separated from each other;

a first guard ring of N+ conductivity type material in said first epitaxial surface, said first guard ring being disposed around said first region, said first region being disposed in overlapping and coincident association with said first guard ring;

a second guard ring of N+ conductivity type material on said first epitaxial surface, said second guard ring being disposed around said second region, said second region being disposed in overlapping and coincident association with said second guard ring; and a channel stopper of P+ conductivity type material in said first epitaxial surface, said channel stopper being disposed around said first region and around said second region, said channel stopper being disposed between said first and second regions.

* * * * *